United States Patent [19]

Hirabayashi

[11] Patent Number: 5,632,812
[45] Date of Patent: May 27, 1997

[54] DIAMOND ELECTRONIC DEVICE AND PROCESS FOR PRODUCING THE SAME

[75] Inventor: Keiji Hirabayashi, Tokyo, Japan

[73] Assignee: Canon Kabushiki Kaisha, Tokyo, Japan

[21] Appl. No.: 466,777

[22] Filed: Jun. 6, 1995

Related U.S. Application Data

[62] Division of Ser. No. 207,043, Mar. 8, 1994, abandoned.

[30] Foreign Application Priority Data

Mar. 10, 1993 [JP] Japan .................................. 5-049521

[51] Int. Cl.$^6$ .................................. C30B 29/04
[52] U.S. Cl. .................... 117/94; 117/95; 117/913; 117/929
[58] Field of Search ...................... 117/929, 94, 95, 117/913

[56] References Cited

U.S. PATENT DOCUMENTS

| | | | |
|---|---|---|---|
| 5,197,651 | 3/1993 | Nakamura et al. | 228/44.7 |
| 5,260,141 | 11/1993 | Tsai et al. | 428/634 |
| 5,306,928 | 4/1994 | Kimoto et al. | 257/77 |

FOREIGN PATENT DOCUMENTS

| | | | |
|---|---|---|---|
| 244081 | 11/1987 | European Pat. Off. | 117/913 |
| 92 22689 | 12/1992 | WIPO | 117/913 |

*Primary Examiner*—Robert Kunemund
*Attorney, Agent, or Firm*—Fitzpatrick, Cella, Harper & Scinto

[57] ABSTRACT

A diamond electronic device constituted of a diamond crystal formed on a substrate comprises a diamond crystal having the ratio (h/L) of length (h) of the diamond crystal in direction substantially perpendicular to the face of the substrate to length (L) of the diamond crystal in direction parallel to the face of the substrate ranging from 1/4 to 1/1000 and an upper face of the diamond crystal making an angle of from substantially 0° to 10° to the face of the substrate, and a semiconductor layer and an electrode layer provided on the diamond crystal, wherein the diamond crystal serves as a heat-radiating layer.

7 Claims, 8 Drawing Sheets

DIAMOND ELECTRONIC DEVICE AND PROCESS FOR PRODUCING THE SAME

This application is a division of application Ser. No. 08/207,043 filed Mar. 8, 1994 now abandoned.

BACKGROUND OF THE INVENTION

1. Field of the Invention

The present invention relates to a semiconductor electronic device, in particular to an electronic device which employs a diamond crystal at least for a heat-radiating layer.

The present invention also relates to a process for producing the above electronic device.

2. Related Background Art

The formation of a semiconductor crystal on a heat radiation layer of an insulator is an important technique to achieve higher response speed of electronic elements. Various materials are being investigated for the insulator. Of the materials, diamond is attracting attention because of its excellent characteristics, which are not achieved by other materials, such as larger band gap (5.5 eV), larger carrier mobility (1800 cm$^2$/V·S for electrons, and 1600 cm$^2$/V·S for positive holes), suitability for a heat sink (or heat-releasing material) owing to higher thermal conductivity (2000 W/(m·K)), excellent insulation properties (not less than $10^{16}$Ω·cm), high hardness, high abrasion resistance, and so forth.

Accordingly, synthesis of diamond from a vapor phase is being developed, in particular, by chemical vapor deposition (CVD). Japanese Patent Application Laid-Open No. 2-110968 discloses formation of a silicon semiconductor layer on a diamond insulator.

Hitherto, diamond crystals shown below have been formed on a substrate by a CVD process.

(1) A diamond crystal is formed by homoepitaxial growth on a natural or artificial diamond base or by heteroepitaxial growth on a cubic boron nitride (c-BN) base having a crystal structure close to that of the diamond crystal. Both of thus obtained diamond crystal films are in epitaxial relation to the underlying base material and are a monocrystalline film having an excellent surface smoothness.

(2) A diamond crystal is formed under ordinary synthesis conditions on a silicon substrate, a high melting-point substrate such as molybdenum, tungsten and tantalum, or a quartz substrate. In the synthesis of such a diamond crystal, the substrate is usually subjected preliminarily to scratching treatment with abrasive diamond grains in order to increase nucleation density. The scratching treatment by use of diamond grains was reported by Iijima et al. (Preprint of 4th Diamond Symposium, p. 115 (1991). According to this report, the scratching treatment causes embedding of fine diamond particles on the surface of the substrate, and these particles serve as nuclei in diamond crystal formation. On the fine diamond particles as the nuclei, the diamond crystals deposit in vapor phase synthesis as below depending on the nucleation density: (i) at a low nucleation density, diamond crystals deposit in a grain form or in random orientation, and (ii) at a high nucleation density, diamond crystals deposit in a polycrystal form having a rough surface. It is known that the diamond polycrystalline film is not oriented generally, but can be made oriented in {100} or {110} direction by selecting the synthesis conditions.

(3) A diamond crystal is formed on a monocrystalline copper plate as the substrate. The crystal has the same crystal orientation as that of the substrate according to Japanese Patent Application Laid-Open No. 2-160695.

The diamond crystals formed by the above conventional processes have disadvantages below.

(1) The monocrystalline film which is formed by heteroepitaxial growth on diamond crystal or on cubic boron nitride is not suitable for practical uses because of extreme expensiveness although it has excellent surface smoothness and high crystallinity.

(2) In the formation of diamond crystal under ordinary synthesis conditions on a silicon substrate, a high melting-point metal substrate, or a quartz substrate, (i) at a low nucleation density, a monocrystal is formed but it is deposited in random orientation directions or (ii) at a high nucleation density, a crystal is obtained usually in a form of a non-oriented polycrystalline film having remarkable surface roughness. If an oriented crystalline film is obtained, the resulting {110}-oriented film has remarkable surface roughness or the resulting {100}-oriented film has inevitably a large thickness (several ten μm or more) for orientation although its surface is parallel to the substrate and has good surface smoothness.

(3) The diamond crystals which are formed on a monocrystalline copper substrate are in a particle shape, and further grow and come contact into each other to become a film with roughness although the film is deposited in epitaxial relation to the substrate.

When a semiconductor electronic device is formed on the diamond crystal or the diamond crystal film of the above item (2) or (3), the surface roughness of the diamond may adversely affect the yield of the device formation, or the crystal grain boundary may give an adverse effect of lowering the performance of the device.

SUMMARY OF THE INVENTION

An object of the present invention is to provide a diamond electronic device which is free from the above technical disadvantages.

Another object of the present invention is to provide a process for producing the electronic device.

A still another object of the present invention is to provide a diamond electronic device prepared by forming a semiconductor layer and a metal layer on a diamond crystal film.

A further object of the present invention is to provide an electronic device which has high durability and excellent semiconductor characteristics, and is useful for various application fields.

A further object of the present invention is to provede a diamond electronic device constituted of a diamond crystal formed on a substrate, which comprises a diamond crystal, and a semiconductor layer and an electrode layer provided on the diamond crystal, wherein the diamond crystal has a ratio (h/L) of length (h) of the diamond crystal in direction substantially perpendicular to the substrate face provided with the diamond crystal to length (L) of the diamond crystal in direction parallel to the substrate face ranging from ¼ to ¹⁄₁₀₀₀ and an upper face of the diamond crystal making an angle of from substantially 0° to 10° to the substrate face, and the diamond crystal serves as a heat-radiating layer.

BRIEF DESCRIPTION OF THE DRAWINGS

FIG. 5A illustrates a semiconductor layer and electrodes formed on a plate-shaped diamond crystal. FIG. 5B illustrates a semiconductor layer and electrodes formed on a diamond crystal film.

FIG. 6A illustrates a semiconductor layer and electrodes formed on a plate-shaped diamond crystal. FIG. 6B illustrates a semiconductor layer and electrodes formed on a diamond crystal film.

FIG. 8A illustrates a semiconductor layer and electrodes formed on a plate-shaped diamond crystal. FIG. 8B illustrates a semiconductor layer and electrodes formed on a diamond crystal film.

FIG. 9A illustrates a substrate after scratching treatment. FIG. 9B illustrates a mask pattern-formed on the substrate of FIG. 9A. FIG. 9C illustrates the substrate of FIG. 9B after etching. FIG. 9D illustrates the substrate of FIG. 9C after removal of the mask. FIG. 9E illustrates selective deposition of plate-shaped diamond crystals on the substrate of FIG. 9D. FIG. 9F illustrates a polycrystalline film formed by growth and contact of the crystals of FIG. 9E.

DETAILED DESCRIPTION OF THE PREFERRED EMBODIMENTS

Figure 1:
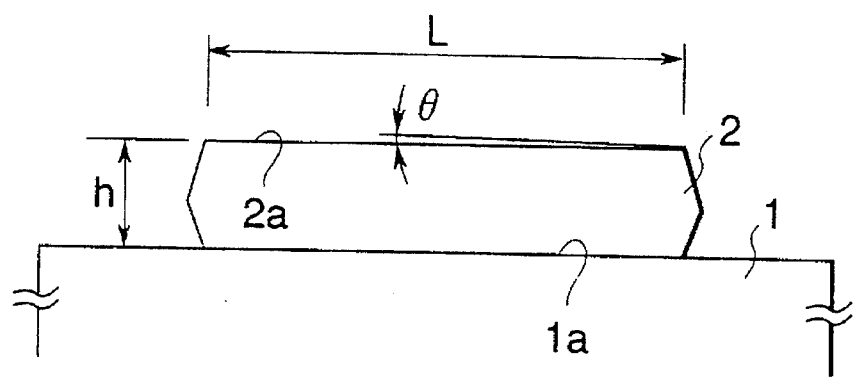
FIG. 1 is a schematic sectional view of a plate-shaped diamond crystal employed in the present invention.

The present invention have been accomplished after comprehensive studies to obtain a diamond electronic device having excellent semiconductor characteristics and having no disadvantage of prior art.

The diamond electronic device of the present invention which is constituted of a diamond crystal formed on a substrate comprises a diamond crystal, and a semiconductor layer and an electrode layer provided on the diamond crystal, wherein the ratio (h/L) of length (h) of the diamond crystal in direction substantially perpendicular to the substrate face to length (L) thereof in direction parallel to the substrate face is in a range from ¼ to 1/1000, an upper face of the diamond crystal makes an angle of from substantially 0° to 10° to the substrate face, and the diamond crystal serves as a heat-radiating layer.

The present invention relates also to a process for producing a diamond electronic device having a diamond crystal formed on a substrate. The process comprises forming a diamond crystal by vapor phase synthesis (1) at a controlled position wherein the diamond crystal is selectively deposited on a substrate and at a controlled crystal nucleation density and (2) at a substrate temperature in a range of from 400° to 900° C. such that the ratio (h/L) of length (h) of the diamond crystal in direction substantially perpendicular to the substrate face to length (L) thereof in direction parallel to the substrate face is in a range from ¼ to 1/1000, and an upper face of the diamond crystal makes an angle of from substantially 0° to 10° to the substrate face; and forming a semiconductor layer and an electrode layer on the diamond crystal.

The present invention is more specifically explained together with the inventor's findings.

The facts as described below were found by the inventor of the present invention as the results of comprehensive investigation of electric characteristics of electronic devices employing diamond crystal particles and diamond polycrystalline film formed by techniques of prior art:

(1) The grain boundary of diamond polycrystal causes deterioration of electric characteristics of the device.

(2) The surface roughness of diamond polycrystal is liable to cause non-uniformity of the electric field application.

(3) The diamond formed by a method of forming diamond of low crystallinity has poor electric characteristics.

Presumably, the phenomena are caused mainly by the presence of an amorphous carbon phase or a graphite phase in the grain boundary of the light-emitting diamond layer. Such a non-diamond phase exists mainly in grain boundaries of the diamond crystals. The non-diamond phase is inferior significantly to crystalline diamond in semiconductor and thermal characteristics. Therefore the non-diamond phase, if it is included in diamond crystal, will impair greatly the electric characteristics of the diamond crystal. Further, the surface roughness of a diamond polycrystal film makes voltage application non-uniform, causing concentration of an electric field, which may lead to dielectric breakdown.

The effects of the shape of a diamond crystal were investigated by the inventor of the present invention for solving the above problems and providing a diamond electronic device having satisfactory electric characteristics. As the results, it was found that excellent semiconductor and excellent thermal characteristics of the diamond electronic device can be achieved by use of a plate-shaped diamond crystal and thereby the present invention has been accomplished.

Figure 2:
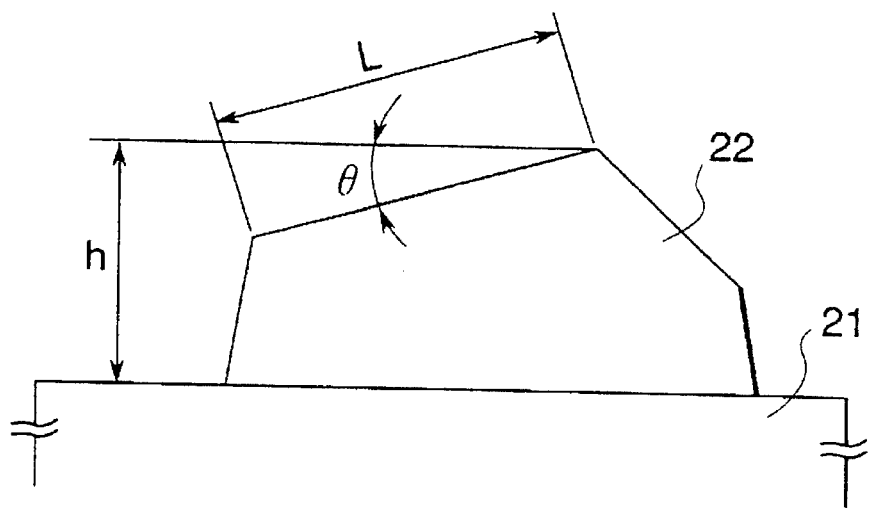
FIG. 2 is a schematic sectional view of a granular diamond crystal.

FIG. 1 is a schematic sectional view of a plate-shaped diamond crystal employed in the present invention. FIG. 2 is a schematic sectional view of an ordinary granular diamond crystal. In FIG. 1, a plate-shaped diamond crystal 2 is formed on a substrate 1. This plate-shaped diamond crystal has the ratio (h/L) of the length (height) h in direction perpendicular to the substrate face to the length (breadth) L in direction parallel to the substrate face is ¼ or less, preferably 1/4.5, more preferably from ⅕ to 1/1000. The upper face 2a of the crystal is a {111} plane, and makes an angle (Θ) of from 0° to 10° to the face 1a of the substrate, the both faces being substantially parallel.

On the contrary, granular diamond crystal 22 formed by a conventional method as shown in FIG. 2 has the ratio h/L of not less than ⅓, generally ½ or more, and the angle Θ varies at random.

The plate-shaped diamond crystal is obtainable only through a process for producing a high-quality diamond crystal such as a CVD process and a burning flame method. The CVD process includes hot-filament CVD, microwave CVD, magneto-microwave CVD, DC plasma CVD, and RF plasma CVD. The carbon source gas in the starting gases employed in the CVD process includes hydrocarbon gases such as methane, ethane, ethylene, and acetylene; organic compounds which are liquid at ordinary temperature such as alcohol and acetone; carbon monoxide, and carbon halides. The gas may contain hydrogen, oxygen, chlorine, fluorine, or the like, if necessary.

(1) Formation of Oriented Diamond Crystal by CVD

The starting material gas needs to contain at least hydrogen, carbon, and oxygen in the compositional formula of the gas. One starting gas may contain all the these elements, or a plurality of gases containing any of the elements may be combinedly used. The concentration of the carbon source in the starting gas is required to be not more than 10%. The carbon source concentration herein means the value derived by calculation: [(carbon source gas flow rate)×(carbon number in compositional formula of carbon source gas)/(total starting gas flow rate)]×100. The "carbon number in compositional formula of carbon source" is, for example, 1 for methane ($CH_4$), 3 for propane ($C_3H_8$), and 3 for acetone ($CH_3COCH_3$). The carbon source concentration is required to be not higher than 10% in order to suppress the supersaturation degree of diamond crystal to prevent growth of amorphous carbon. The minimum of the carbon source concentration is not specially limited, but at the concentration of 0.01% or lower, the diamond crystal cannot always be formed at a practical formation rate.

Additionally, in the CVD process, the ratio of the number of oxygen atoms to the number of carbon atoms (O/C) in the starting gas is in a range of $0.5 \leq O/C \leq 1.2$, preferably $0.7 \leq O/C \leq 1.1$. At the O/C ratio of lower than 0.5, the effect of oxygen addition is not achievable, and a plate-shaped diamond crystal is not formed. At the ratio of higher than 1.2, practical rate of diamond formation is not achievable owing to etching effect of oxygen. An oxygen addition gas such as $O_2$, $H_2O$, and $N_2O$ may be added to the starting gas to adjust the above O/C value.

In the case where an oxygen-containing organic compound such as an alcohol is employed as the carbon source, a plate-shaped diamond crystal can be formed even at a relatively low O/C value. For example, in the case where hydrogen and ethanol ($C_2H_5OH$) are used as the starting gases, a satisfactory plate-shaped diamond crystal can be obtained at the O/C value of 0.5. The reason therefor is not known. Probably, it is because that the oxygen-containing compound easily generates an active species of oxygen (OH radical).

The plate-shaped diamond crystal employed in the present invention is formed at a relatively low nucleation density. For example, in crystal formation by a CVD process such as plasma CVD and filament CVD, a plate-shaped diamond crystal is formed only at the nucleation density of not higher than $2\times10^6$ nuclei/mm². The reason therefor is not clear. Probably, it is because that the sufficient amount of etching gas (hydrogen radicals or OH radicals) is required in order to control the crystal growth in height direction and the sufficient amount of active species ($CH_x$ radicals, or the like) reaching the lateral face for diamond formation in order to promote the growth in lateral direction.

(2) Formation of Oriented Diamond Crystal by Burning Flame Process

Oxygen-acetylene flame is employed in a burning flame process. The molar ratio of oxygen to acetylene in the main starting gas is in a range of $0.9 \leq O_2/C_2H_2 \leq 1.0$, preferably $0.95 \leq O_2/C_2H_2 \leq 0.99$ for forming the oriented diamond with high reproducibility at a relatively high growth rate (growth rate in lateral direction: several ten µm/hr)

In the burning flame process, the nucleation density of the diamond crystal is controlled to be not higher than $1\times10^5$ nuclei/mm², preferably in a range of from $1\times10^2$ nuclei/mm² to $1\times10^5$ nuclei/mm². In the burning flame process, the nucleation density is controlled to be lower than that in the CVD process. This is because, in the burning flame process, the growth rate of a plate-shaped diamond crystal in lateral direction (several ten µm/hr) is ten times or more the growth rate in hot-filament CVD or microwave CVD.

To obtain a plate-shaped crystalline diamond, the intervals between the centers of crystals need to be sufficiently large. The necessary interval depends on the crystal formation conditions, but is usually equal approximately to the width of the plate-shaped diamond crystal to be formed (10 µm if the width is 10 µm).

The upper face of the plate-shaped diamond crystal is a {111} plane having morphology of a triangle or a hexagon.

The plate-shaped diamond crystal is monocrystal, or a twin crystal having a twinning plane in the plate. The most of the plate-shaped diamond crystal has a twinning plane parallel to the upper face of the crystal. This is considered to be due to the fact that a recessed incident angle is made by the formation of the twinning plane, and the effect thereof, so-called recessed incident angle effect, tends to promote the growth of the crystal in the direction of the recessed incident angle to form diamond crystal in a plate shape. The plane is not limited to one, but two or more twinning planes are sometimes formed.

The plate-shaped diamond crystal employed in the present invention can be grown into a film shape and brought into contact with each other to form a crystalline diamond film. The resulting diamond crystal film formed from plate-shaped diamond crystals has small surface roughness as the results of formation by growth and coalescence of plate-shaped diamond crystals having relatively uniform crystal particle height. The film is a film with high smothness, that is, a small surface roughness, for example, the maximum surface roughness of not higher than 100 nm.

The electronic device of the present invention is prepared by forming plate-shaped diamond crystal through a selective deposition method on a predetermined site. The selective deposition of diamond crystal can be conducted, for example, by the method disclosed in Japanese Patent Application Laid-Open No. 2-30697 by the inventor of the present invention.

According to the method disclosed by this application, a diamond crystal can be formed from a single nucleus by controlling a sufficiently small size of the nucleation site of 10 µm or less. When diamond crystal is formed from a single nucleus by the burning flame process, the nucleation density is lower than that in other synthesis method. If the nucleation site is in a size of 10 µm², deposition defect is liable to occur. Therefore, in order to grow a diamond crystal from a single nucleus in the burning flame process, the size of the nucleation site is made to be in a range of from 10 µm² to 100 µm², preferably in a range of from 25 µm² to 80 µm².

In the selective deposition of diamond according to the process disclosed in the above Japanese Patent Application Laid-Open No. 2-30697, but the deposition process is not limited thereto, a substrate is subjected to a scratching treatment, a patterned mask is formed on the substrate, the substrate is subjected to etching treatment, and then the mask is removed to obtain a scratching-treated site in a pattern. Otherwise, the scratching-treated site can be formed in a pattern by forming a patterned mask on the substrate and removing the mask. In another method, the substrate is subjected to a scratching treatment, and a patterned mask is formed on the scratched substrate with a heat resistant material to form a scratched portion in a pattern on the substrate surface. The scratching treatment with diamond abrasive grain is not limited to a special method, and includes grinding, ultrasonic treatment, sand-blasting, and the like by use of diamond abrasive grain.

An example of selective deposition of diamond on a substrate by utilizing the pattern of scratched portion formed by use of diamond abrasive grains is explained below by reference to the schematic drawings of FIG. 9A to FIG. 9F.

Figure 9A:
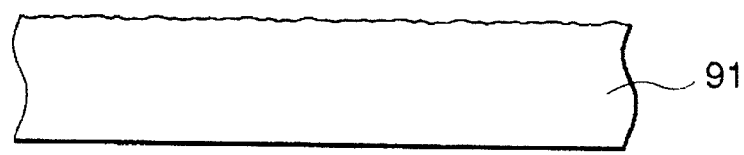
FIGS. 9A to 9F illustrate steps of diamond film formation by selective deposition according to the present invention.
Figure 9B:
Figure 9C:
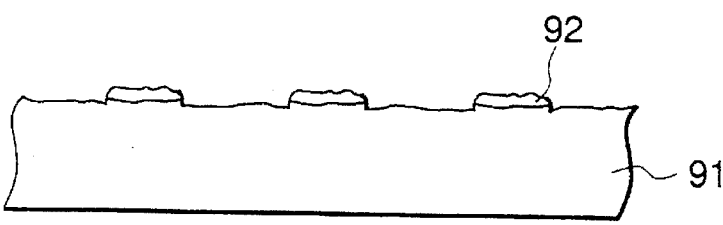

Firstly, the surface of the substrate 91 is treated for scratching with diamond abrasive grains (FIG. 9A). A mask 92 is formed on the substrate surface (FIG. 9B). The material of the mask is not specially limited. An example of the mask is a resist formed in a pattern by photolithography. Then the substrate having the mask 92 thereon is etched to form a pattern of the scratched portion (FIG. 9C).

The etching may be conducted either by dry etching or by wet etching. The wet etching is conducted, for example, by use of a hydrofluoric acid-nitric acid mixture. The dry etching is conducted, for example, by plasma etching method, or ion beam etching. The etching gas for plasma etching includes rare gases such as argon, helium, and neon; oxygen, fluorine, hydrogen, $CF_4$, and the like. The etching depth is not less than 10 nm, preferably in a range of from about 50 to about 1000 nm, more preferably from 80 to 200 nm.

Figure 9D:
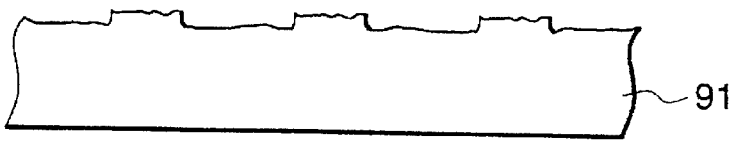
Figure 9E:
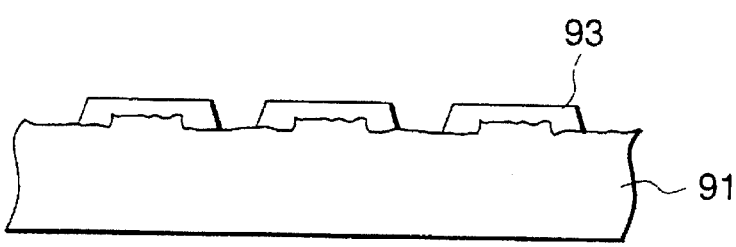
Figure 9F:
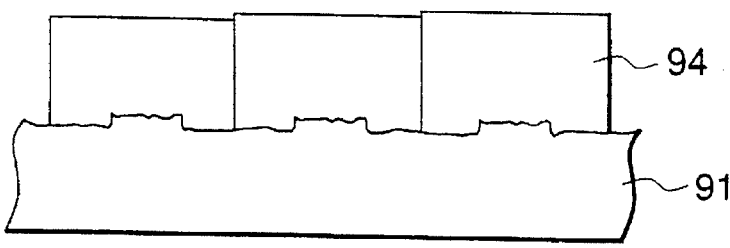

Subsequently, the mask 92 is removed (FIG. 9D). A plate-shaped diamond crystal is formed thereon by a vapor-phase synthesis method, whereby a plate-shaped diamond crystals 93 are formed selectively only on the scratch-treated sites (FIG. 9E). The crystals are grown and allowed to coalesce into a film of a diamond crystal (FIG. 9F).

The thickness of the formed diamond film depends on the synthesis conditions, particularly on the nucleation density, and cannot be simply predicted. Generally, the crystals become a film when the thickness of the deposited crystals is 10 µm or more.

On the diamond crystal formed above, a semiconductor layer and an electrode layer are formed. The electrode layer is formed from a metal, a semiconductor, or a transparent electroconductive film. It is formed in a thickness ranging from about 50 nm to about 200 nm using these materials through a process such as vacuum vapor deposition, ion-plating, sputtering, spraying, and CVD.

The electrode may be either a Schottky junction electrode or an ohmic junction electrode. The material for these electrodes is selected depending on the surface state of the diamond crystal (cleanness of the surface, and adsorbed species). Generally, in the case of p-type diamond crystal, a material exhibiting higher work function is employed as an ohmic junction electrode, and a material exhibiting a lower work function is employed for a Schottky junction electrode.

The semiconductor layer may be made from silicon, diamond, gallium arsenide, silicon carbide, indium, germanium, or the like. Of these, silicon and diamond are preferred. The silicon semiconductor is formed by a known method such as vacuum deposition, sputtering, and CVD. By such a method, a p-type silicon layer or an n-type silicon layer, or a pn junction, a pnp junction, or an npn junction of a silicon semiconductor, or the like is formed.

The method for forming the diamond semiconductor layer need not be the same as that for forming the aforementioned plate-shaped diamond crystal. In formation of the p-type semiconductor, boron may be incorporated into the diamond crystal by addition of diborane ($B_2H_6$), boron trifluoride ($BF_3$), or the like as a boron source to the starting gas, or otherwise by addition of boric acid ($H_3BO_3$) or the like into the organic compound which is liquid at ordinary temperature (alcohol, acetone, ether, etc.) when such an organic compound is used as a carbon source.

In formation of the n-type semiconductor, phosphorus, lithium, or the like may be incorporated into the diamond crystal by addition of phosphine ($PH_3$) to a starting gas, by addition of solid or liquid lithium or a lithium compound by heating and evaporation at a suitable temperature, or by a like method. In the case where an organic compound which is liquid at ordinary temperature (alcohol, acetone, ether, etc.) is used as a carbon source, the above elements may be incorporated into the diamond crystal by addition of phosphoric acid, lithium, or lithium compound to the organic compound.

The p-type diamond layer or the n-type diamond layer, or a pn junction, an np junction or an npn junction of a diamond semiconductor or the like is formed by the diamond crystal growth and the impurity addition as described above.

In the electronic device of the present invention, the semiconductor layer may be a hetero junction (junction between different materials): e.g., junction between a diamond semiconductor and silicon semiconductor, junction between a diamond semiconductor and gallium arsenide, and junction between silicon and gallium arsenide.

The present invention is described more specifically by reference to Examples.

EXAMPLE 1

Figure 3:
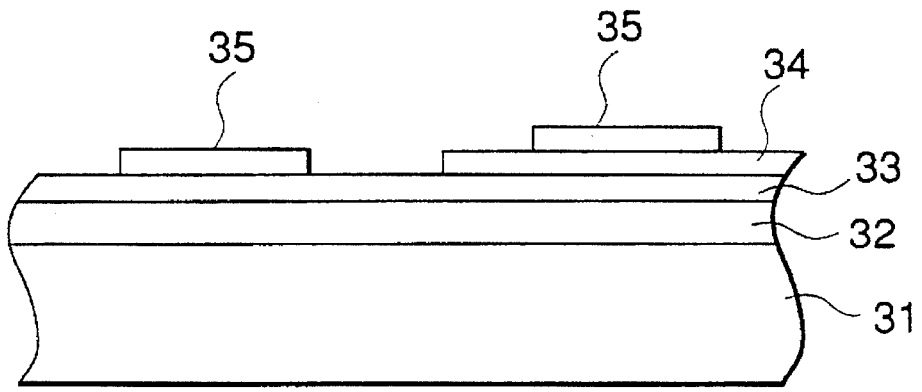
FIG. 3 is a sectional view of a pn junction diode which is one embodiment of devices of the present invention.
Figure 10:
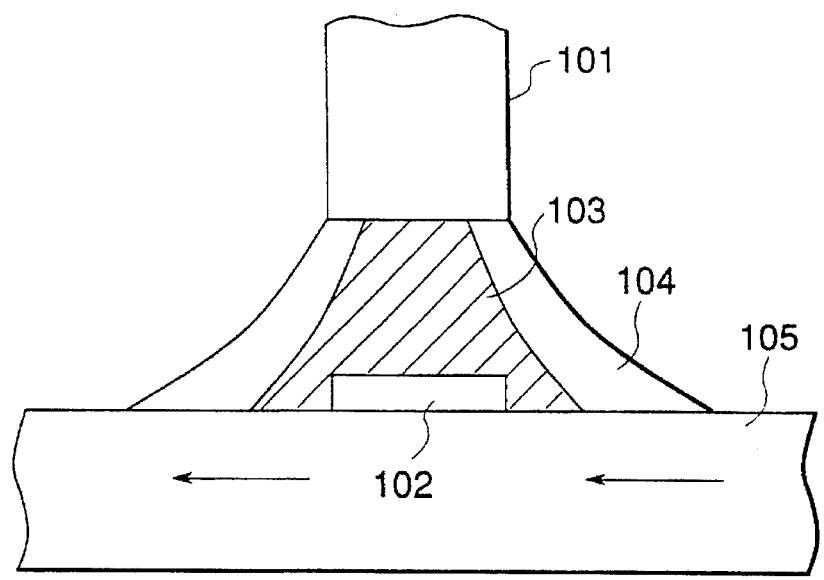
FIG. 10 is a schematic sectional view of the portion around the diamond crystal formed by a burning flame method.

A pn junction device of a silicon crystal as shown in FIG. 3 was formed by deposition of a diamond crystal through a burning flame method shown in FIG. 10.

FIG. 10 illustrates a burning flame method with an oxygen-acetylene flame burner. In the drawing, the numeral 101 denotes a burner; 102, a substrate; 103, inner flame; 104, outer flame; and 105, a substrate holder. The substrate is cooled by cooling the substrate holder with water.

A silicon monocrystal plate (25 mm in diameter, 0.5 mm thick) was used as the substrate. This substrate was put into an alcohol in which diamond particles of 15 µm in average diameter were dispersed, and ultrasonic wave vibration was applied thereto for scratching treatment. Thereafter, on the substrate, a PMMA based resist pattern was formed in 2 µm diameter at a 30 µm pitch by means of an aligner. The substrate was etched to a depth of about 100 nm by means of an argon ion beam etching apparatus under the etching conditions of acceleration voltage of 1 kV and etching time of 8 minutes.

Then the resist was removed from the substrate by an organic solvent, and the substrate was placed on a burning flame treatment apparatus as shown in FIG. 10. The burning flame treatment was practiced under the conditions: acetylene gas flow rate: 1.5 l/min, oxygen gas flow rate: 1.4 l/min, substrate temperature: 650° C., and synthesis time: 4 hours. The resulting diamond crystal was a diamond polycrystal film (denoted by the numeral 32 in FIG. 3) having a thickness of about 18 µm and of excellent flatness.

Another sample was synthesized under the same conditions as above except that the synthesis time was one hour. With regard to this sample, it was observed that plate-shaped diamond grains of 15 µm in average diameter having hexagonal {111} plane orienting in a direction parallel to the substrate were formed selectively on the remaining scratched portions (portions which had been protected by the resist).

On the diamond film, a p-type silicon polycrystal film 33 was formed by a known thermal CVD process. Thereon, an n-type silicon polycrystal film 34 was formed. On the n-type silicon polycrystal film, a resist was formed on a predetermined area by a known light exposure method, and it was removed by plasma dry etching. An electrode 35 was formed respectively on the p-type silicon layer, and on the n-type silicon layer. Thus a pn junction diode was completed.

This pn junction diode had stable rectification characteristics with stable heat release even at a large electric current flow for a long time, because the diamond polycrystal film 32 is used as the heat-radiating layer.

EXAMPLE 2

Figure 4:
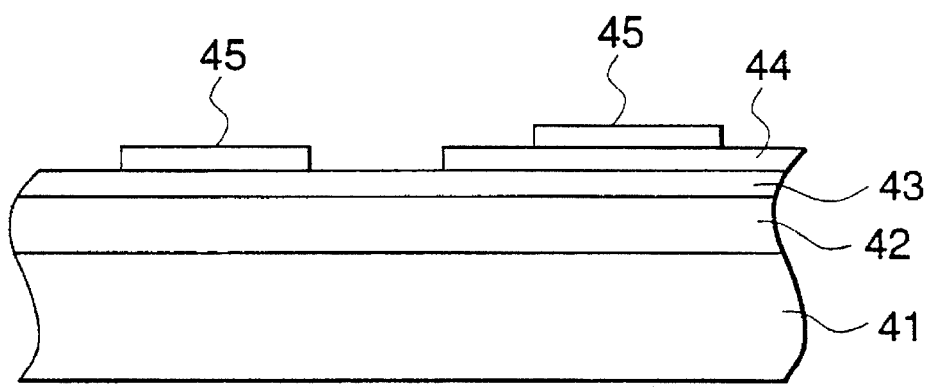
FIG. 4 is a sectional view of a pn junction diode which is another embodiment of devices of the present invention.
Figure 11:
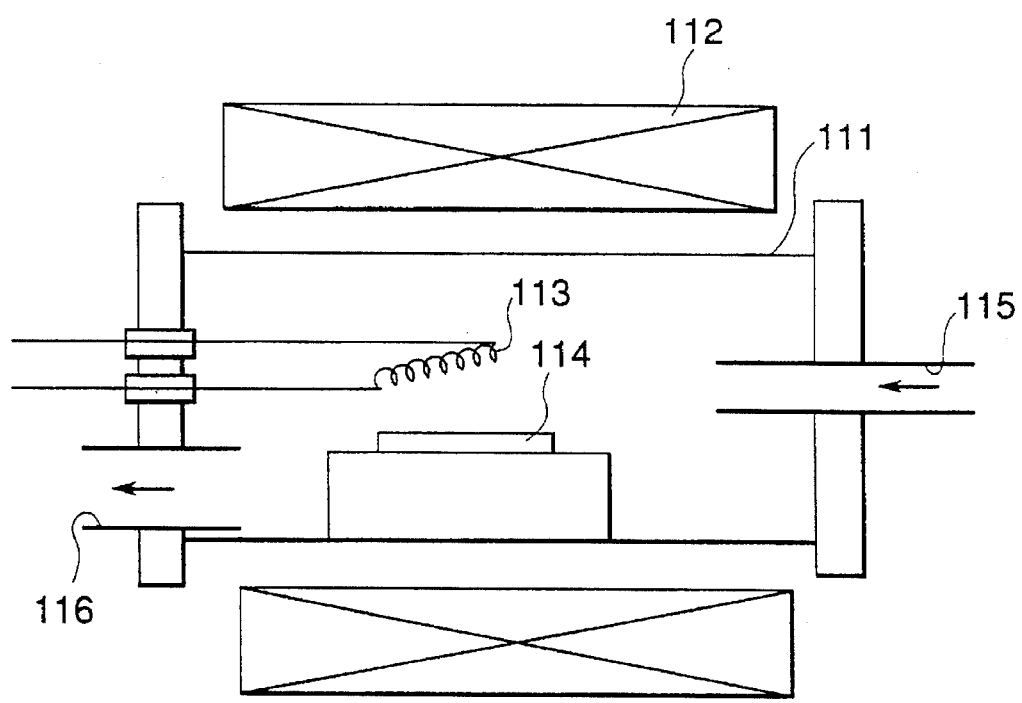
FIG. 11 is a schematic sectional view of a hot filament type CVD system.

A pn hereto junction diode was prepared by depositing a diamond crystal by hot filament CVD as shown in FIG. 11 and forming a p-type diamond crystal and an n-type silicon crystal as shown in FIG. 4.

FIG. 11 illustrates schematically a hot filament CVD method employing hydrogen-ethyl alcohol as a starting gas. In the drawing, the numeral 111 denotes a quartz reaction tube; 112, an electric furnace; 113, a filament made of tantalum; 114, a substrate; 115, a starting gas inlet connected to a gas cylinder, an alcohol vaporizer, a flow controller, a valve, etc. which are not shown; and 116, a gas outlet connected to a pressure control valve, and an evacuation system (combination of a mechanical booster pump and a rotary pump) which are not shown in the drawing.

The substrate 114 employed was a silicon monocrystal which had been preliminarily treated in the same manner as in Example 1. The diamond was synthesized under the conditions: starting gases and flow rates: hydrogen 200 ml/min, and ethyl alcohol 2 ml/min, filament temperature: 2050° C., substrate temperature: 680° C., pressure: $1.3 \times 10^4$ Pa, synthesis time: 12 hours. The resulting diamond crystal was a diamond polycrystal (42 in FIG. 4) having a thickness of about 18 μm with excellent flatness.

Another sample was synthesized under the same conditions as above except that the synthesis time was one hour. With regard to this sample, it was observed that plate-shaped diamond grains of 8 μm in average diameter having hexagonal {111} plane orienting in a direction parallel to the substrate were formed selectively on the remaining scratched portions (portions which had been protected by the resist).

On the diamond crystal film, a p-type diamond crystal film 43 in the same manner as in the above diamond synthesis except that a starting gas and its flow rate were boric acid-containing ethyl alcohol (B/C=100 ppm and 2 ml/min, and the synthesis time was one hour. Thereon, an n-type silicon polycrystal film 44 was formed. Further thereon, a resist was formed on a predetermined area on the n-type silicon film by a known light exposing method, and it was removed by dry etching by plasma. An electrode 45 was formed respectively on the p-type diamond layer 43 and on the n-type silicon layer 44. Thus a pn junction diode was completed.

This pn-junction diode exhibited excellent rectification characteristics.

EXAMPLE 3

Figure 5A:
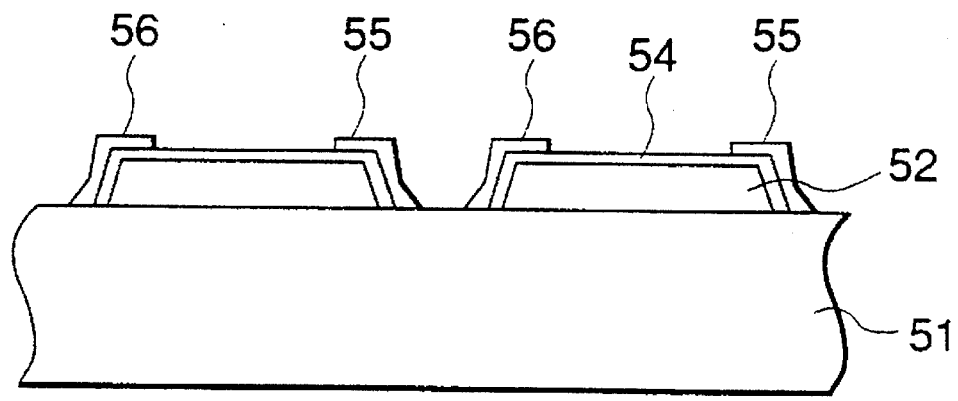
FIGS. 5A and 5B are sectional views of a Schottky junction diode which is one embodiment of diveces of the present invention.

A Schottky diode device was prepared as shown in FIG. 5A.

Plate-shaped diamond crystals 52 were formed in the same manner as in Example 2 except that the diamond formation was conducted for 4 hours. Then p-type diamond layers 54 were formed under the same conditions as in Example 2. On the diamond layers, an aluminum electrode as a Schottky junction electrode 55 and a gold electrode as an ohmic junction electrode 56 were formed by vacuum deposition, each having thickness of about 150 nm such that the electrodes do not overlap with each other. Thus a Schottky diode was completed. This Schottky diode exhibited excellent rectification characteristics.

EXAMPLE 4

Figure 5B:
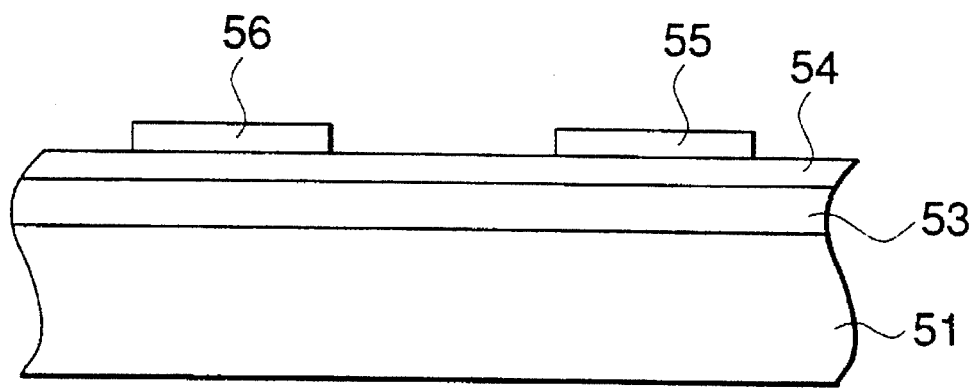

A Schottky diode device as shown in FIG. 5B was prepared.

On a substrate 51, a diamond film 53 was formed by growth and coalescence of plate-shaped diamond crystals and a p-type diamond layer 54 was formed in the same manner as in Example 2. Thereon, an aluminum electrode as a Schottky junction electrode 55 and a gold electrode as an ohmic junction electrode 56 were formed by vacuum deposition, each having thickness of about 150 nm such that the electrodes do not overlap with each other. Thus a Schottky diode was completed. This Schottky diode exhibited excellent rectification characteristics.

EXAMPLE 5

Figure 6A:
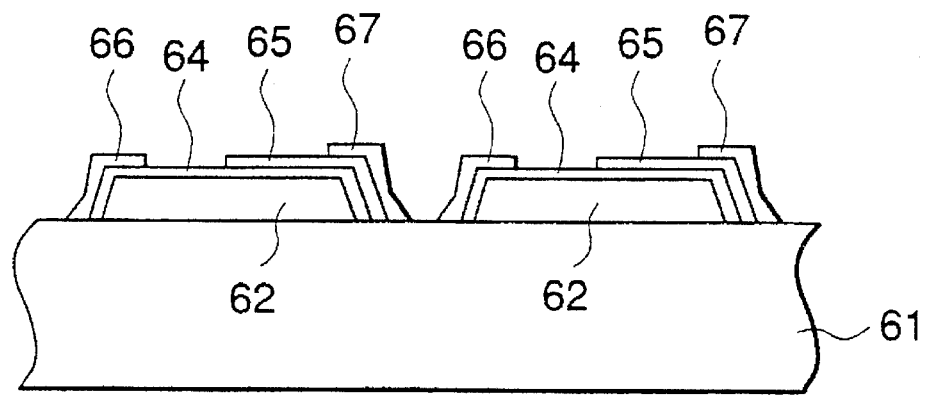
FIGS. 6A and 6B are sectional views of a pn-junction light-emitting diode which is one embodiment of devices of the present invention.

A pn junction type light-emitting diode device was prepared as shown in FIG. 6A.

Firstly, a silicon substrate 61 was subjected to preliminary treatment (i.e., patterning, etching, and washing) under the same conditions as in Example 1. Thereon, plate-shaped diamond crystal 62 and p-type diamond crystal 64 were formed in the same manner as in Example 3. On half of the areas of the p-type diamond crystals, an $SiO_2$ film (thicness: 100 nm) was formed as a mask. Further, on this plate-shaped diamond crystal, an n-type diamond semiconductor layer was formed in a manner as described below.

Ethyl alcohol was used as the carbon source in which lithium metal was dissolved in a lithium-carbon ratio (Li/C) of 50 ppm. The above substrate was placed in a hot-filament CVD apparatus other than the one used in Example 2 for n-type semiconductor layer formation. An n-type semiconductor layer was formed under the following conditions: starting gases and flow rate: hydrogen (200 ml/min) and ethyl alcohol (2 ml/min), filament temperature: 2050° C., substrate temperature: 680° C., pressure $6.65 \times 10^3$ Pa, and synthesis time: one hour. Thereby, an n-type diamond semiconductor layer 65 which serve as pn junction was formed on the area of the diamond crystal other than that of the above $SiO_2$ film.

The $SiO_2$ film was removed by hydrofluoric acid, and platinum electrode 66 was formed on the p-type diamond layer, and aluminum electrodes 67 was formed on the n-type diamond layer, each in thickness of 100 nm, such that the electrodes do not overlap with each other.

DC current was applied by using the platinum electrode on the p-type diamond crystal as the anode and the aluminum electrode on the n-type diamond crystal as the cathode by means of a power source not shown in the drawing. Thereby light emission was observed at the pn junction portion at voltage application of several to several ten volts with light emission peak wavelength of about 430 nm. This sample was tested for durability for 200 hours, and was found to have good durability without deterioration such as decrease of luminance and element breakdown.

EXAMPLE 6

Figure 6B:
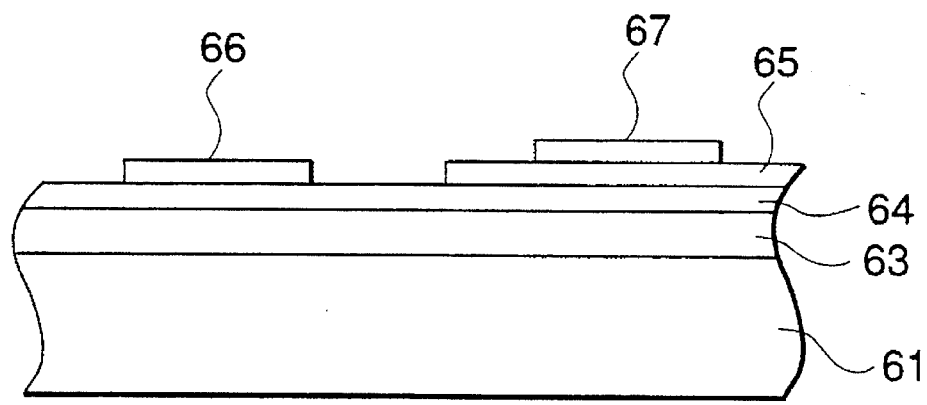

A pn junction type light-emitting diode device was prepared as shown in FIG. 6B.

Firstly, a silicon substrate 61 was subjected to preliminary treatment (i.e., patterning, etching, and washing) under the same conditions as in Example 1. A diamond film 63 was formed by growth and coalescence of plate-shaped diamond crystals and a p-type diamond layer 64 was formed in the same manner as in Example 4. On half of the area of the p-type diamond crystal, an $SiO_2$ film (thickness: 100 nm) was formed as a mask. Further, on the plate-shaped crystal, an n-type diamond semiconductor layer 65 was formed in the same manner as in Example 5.

A platinum electrode 66 and an aluminum electrode 67 were formed in the same manner as in Example 5 such that the electrodes do not overlap with each other. DC current was applied by using the platinum electrode on the p-type diamond crystal as the anode and the aluminum electrode on the n-type diamond crystal as the cathode by means of a power source not shown in the drawing. Thereby light emission was observed at the pn junction portion at voltage application of several to several ten volts with light emission peak wavelength of about 430 nm. This sample was tested for durability for 200 hours, and was found to have good durability without deterioration such as decrease of luminance and element breakdown.

COMPARATIVE EXAMPLE 1

A silicon monocrystal plate (25 mm in diameter, 0.5 mm thick) was put into an alcohol in which diamond particles of 15 μm in average diameter were dispersed, and ultrasonic wave vibration was applied thereto for scratching treatment. By this scratching treatment, the nucleation density of the diamond was raised to not less than $5 \times 10^6$ nuclei/$mm^2$. Then a diamond film 63, a p-type diamond crystal 64, and an n-type diamond semiconductor layer 65 were formed on the substrate in the same manner as in Example 6 except that the substrate temperature was 950° C. Electrodes 66 and 67 were formed in the same manner as in Example 4 to form a pn junction type light-emission diode.

DC current was applied by using the platinum electrode on the p-type diamond crystal as the anode and the aluminum electrode on the n-type diamond crystal as the cathode by means of a power source not shown in the drawing. Thereby light emission was observed at the pn junction portion at voltage application of several to several ten volts with light emission peak wavelength of about 430 nm. This sample was tested for durability in the same manner as in Example 6. As the results, the luminance decreased and the element failure (presumed to be element breakdown) occurred for about 150 hours.

EXAMPLE 7

Figure 7:
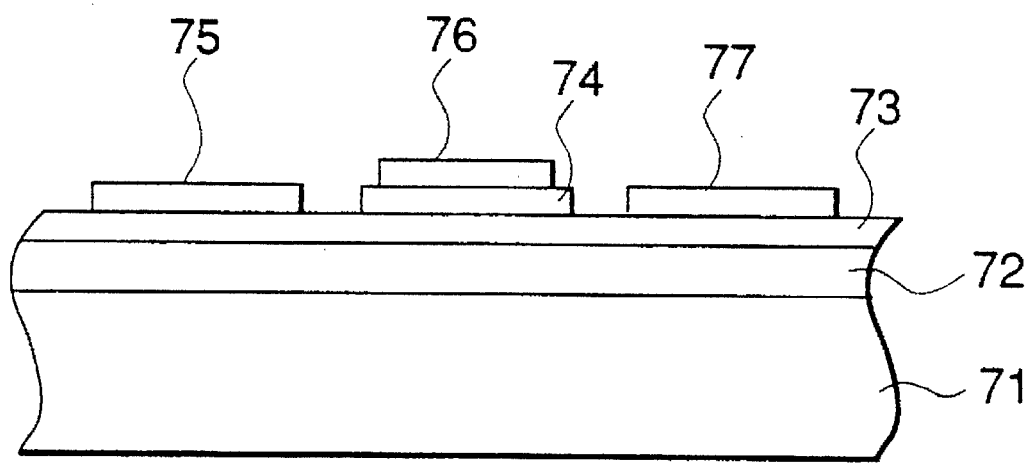
FIG. 7 is a sectional view of a transistor which is one embodiment of devices of the present invention.

A transistor as shown in FIG. 7 was prepared.

A silicon monocrystal plate 71 (25 mm in diameter, 0.5 mm thick) was used as the substrate. This substrate was put into an alcohol in which diamond particles of 15 μm in average diameter were dispersed, and ultrasonic wave vibration was applied thereto for scratching treatment. On the substrate, a PMMA based resist pattern was formed in 2 μm diameter at a 25 μm pitch by means of an aligner. The substrate was etched to a depth of about 100 nm by means of an argon ion beam etching apparatus under the etching conditions of acceleration voltage of 1 kV and etching time of 8 minutes. Then the resist was removed from the substrate by an organic solvent, and the substrate was placed on a known microwave plasma CVD apparatus.

A diamond crystal was synthesized under the conditions: starting gas and flow rate: hydrogen (150 ml/min) and carbon monoxide (10 ml/min), microwave power: 500 W, substrate temperature: 640° C., pressure: $6.65 \times 10^3$ Pa, and synthesis time: 12 hours. Thereby, a smooth diamond film 72 was formed.

Another sample was synthesized under the same conditions as above except that the synthesis time was 4 hours. With this sample, it was observed that plate-shaped diamond grains having hexagonal {111} plane orienting in a direction parallel to the substrate deposited on the substrate.

A p-type diamond film 73 was formed in the same manner as in synthesis of the aforementioned diamond film, except that diborane gas (100 ppm diborane in diluent hydrogen) was added in the starting gas at a flow rate of 5 ml/min and synthesis time was one hour. A insulating diamond film 74 was formed in the same manner as in formation of the above diamond film 72 except that an $SiO_2$ film was employed as the selective deposition mask and the synthesis time was one hour. After removal of the $SiO_2$ film, a source electrode 75 and a drain electrode 77 were formed from titanium, and a gate electrode 76 was formed from aluminum.

The resulting transistor was found to have excellent voltage-current characteristics with little leak current (not more than 5 nA at 40 V) between the gate and the source.

EXAMPLE 8

Figure 8A:
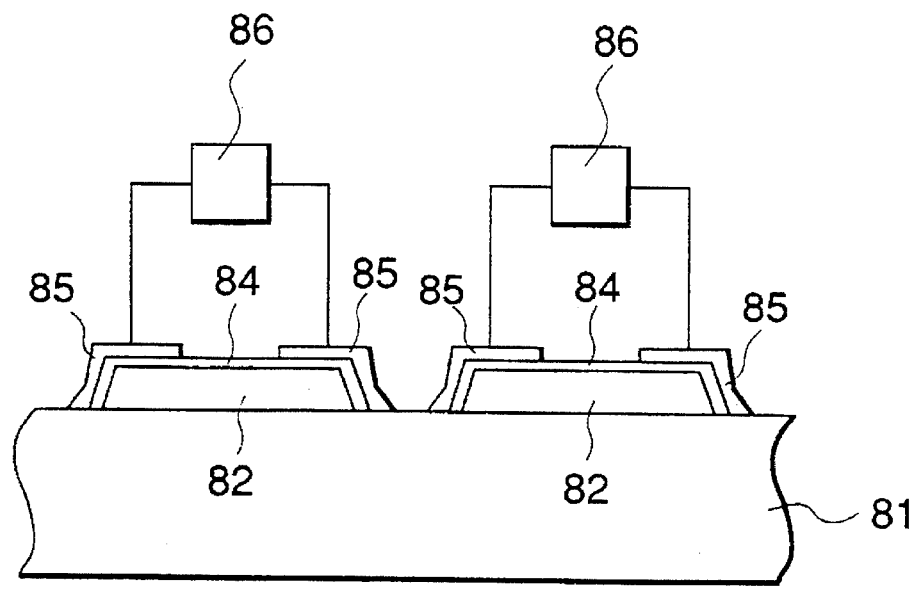
FIGS. 8A and 8B are sectional views of a UV light detection device which is one embodiment of devices of the present invention.

An ultraviolet light detection device as shown in FIG. 8A was prepared.

A silicon monocrystal plate 81 (25 mm in diameter, 0.5 mm thick) was used as the substrate. This substrate was put into an alcohol in which diamond particles of 15 μm in average diameter were dispersed, and ultrasonic wave vibration was applied thereto for scratching treatment. On the substrate, a PMMA based resist pattern was formed in 2 μm diameter at a 25 μm pitch by means of an aligner. The substrate was etched to a depth of about 100 nm by means of an argon ion beam etching apparatus under the etching conditions of acceleration voltage of 1 kV and etching time of 8 minutes. Then the resist was removed from the substrate by an organic solvent, and the substrate was placed on a known microwave plasma CVD apparatus.

Diamond crystal was synthesized under the conditions: starting gas and flow rate: hydrogen (150 ml/min) and carbon monoxide (10 ml/min), microwave power: 550 W, substrate temperature: 670° C., pressure: $4.0 \times 10^3$ Pa, and synthesis time: 8 hours. Thereby, a plate-shaped diamond particle was observed to deposit which have a hexagonal {111} plane in direction parallel to the substrate face.

A p-type diamond film 84 was formed in the same manner as in synthesis of the above diamond film, except that diborane gas (100 ppm diborane in diluent hydrogen) was added in the starting gas at a flow rate of 5 ml/min and the synthesis time was one hour.

On the p-type diamond film, gold electrode 85 was formed. Thereto, voltage was applied by power sources 86, and the change of the resistance of the diamond film was observed with irradiation of ultraviolet light (mercury lamp). The ultraviolet light detection device was found to be excellent in detection sensitivity and optical responsiveness.

EXAMPLE 9

Figure 8B:
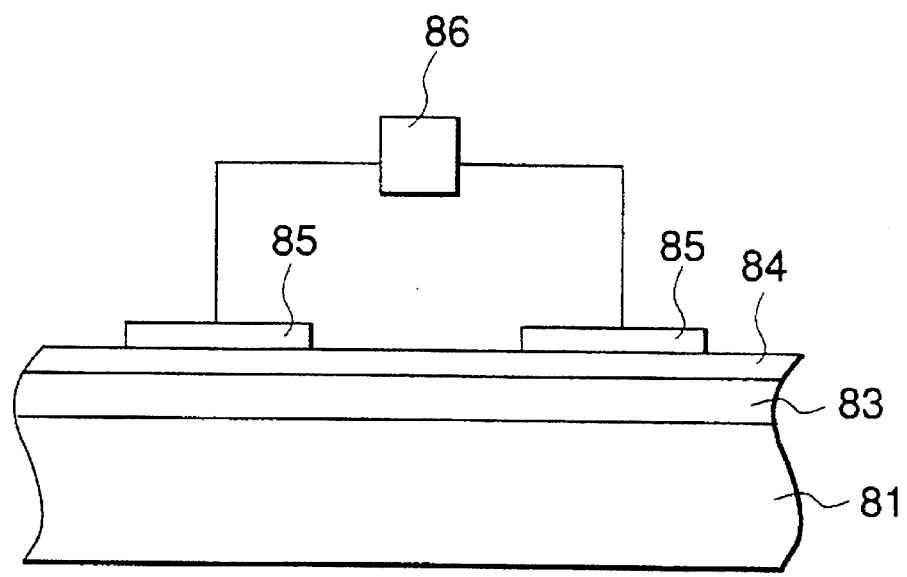

An ultraviolet light detection device as shown in FIG. 8B was prepared.

Firstly, an alumina substrate 81 was subjected to preliminarily treatment (patterning, etching, and washing). Then diamond was formed in the same manner as in Example 8 except that the synthesis time was 15 hours. Thereby a diamond film 83 was formed by growth and coalescence of plate-shaped diamond crystals. Further a p-type diamond crystal 84 was formed in the same manner as in Example 8.

Gold electrode 85 was formed on the p-type diamond film. Thereto voltage was applied by means of a power source 86, and change of the resistance of the diamond film during irradiation of ultraviolet light (with a mercury pump). As the results, the ultraviolet detection device was excellent in detection sensitivity and optical responsiveness.

As described above, the electronic device of the present invention releases heat stably and effectively to give stable working characteristics even in severe environment for a long term, owing to the use of a heat-radiation layer which is constituted of a diamond crystal film formed from growth and coalescence of plate-shaped crystals.

What is claimed is:

1. A process for producing a diamond electronic device having a plate shaped diamond crystal formed on a substrate, which comprises forming the plate shaped diamond crystal by vapor phase synthesis (1) by selective deposition on the substrate at a controlled depositing position and at a controlled crystal nucleation density and (2) at a substrate temperature in a range from 400° to 900° C. such that a ratio (h/L) of length (h) of the plate shaped diamond crystal in a direction substantially perpendicular to a face of the substrate to length (L) of the plate shaped diamond crystal in a direction parallel to the face of the substrate is in the range from 1/4 to 1/1000, and an upper face of the plate shaped diamond crystal is a {111} plane which makes an angle from substantially 0° to 10° to the face of the substrate; and forming a semiconductor layer and an electrode layer on the plate shaped diamond crystal.

2. The process for producing a diamond electronic device according to claim 1, wherein the diamond crystal is a diamond crystal film formed by coalescence of a plurality of crystals into a film shape.

3. The process for producing a diamond electronic device according to claim 1, wherein the crystal nucleation density is not more than $2 \times 10^6$ nuclei/mm$^2$, and the vapor phase synthesis is conducted by CVD at a carbon source concentration in starting gas is not higher than 10% and the ratio of oxygen atom number to carbon atom number per unit quantity ranges from 0.5 to 1.2.

4. The process for producing a diamond electronic device according to claim 2, wherein the crystal nucleation density is not more than $2 \times 10^6$ nuclei/mm$^2$, and the vapor phase synthesis is conducted by CVD at a carbon source concentration in starting gas is not higher than 10% and the ratio of oxygen atom number to carbon atom number per unit quantity ranges from 0.5 to 1.2.

5. The process for producing a diamond electronic device according to claim 1, wherein the crystal nucleation density is not higher than $1 \times 10^5$ nuclei/mm$^2$, and the vapor phase synthesis is conducted by a burning flame method at the ratio of oxygen gas to acetylene of from 0.9 to 1.0.

6. The process for producing a diamond electronic device according to claim 2, wherein the crystal nucleation density is not higher than $1 \times 10^5$ nuclei/mm$^2$, and the vapor phase synthesis is conducted by a burning flame method at the ratio of oxygen gas to acetylene of from 0.9 to 1.0.

7. The process for producing a diamond electronic device according to claim 1, wherein the plate shaped diamond crystal serves as a heat-radiating layer.

* * * * *

UNITED STATES PATENT AND TRADEMARK OFFICE
CERTIFICATE OF CORRECTION

PATENT NO. : 5,632,812

DATED : May 27, 1997

INVENTOR : KEIJI HIRABAYASHI

It is certified that error appears in the above-identified patent and that said Letters Patent is hereby corrected as shown below:

COLUMN 1

Line 54, "(1991)." should read --(1991)).--.

COLUMN 2

Line 6,  "below." should read --as noted below.--;
   Line 22, "has inevitably" should read --inevitably has--;
   Line 28, "contact into" should read --into contact with--;
   Line 44, "still another" should read --further--;
   Line 52, "provede" should read --provide--;
   Line 57, "direction" should read --a direction--;
   Line 60, "direction" should read --a direction--.

COLUMN 3

Line 8,  "diveces" should read --devices--;
   Line 46, "have" should read --has--.

COLUMN 4

Line 12, "found" should read --discovered--;
   Line 13, "results" should read --result--;
   Line 28, "inferior" should be deleted;
   Line 29, "significantly" should read --significantly inferior--;
   Line 31, "impair greatly" should read --greatly impair--;
   Line 40, "results," should read --result,--;
   Line 55, "(⊕)" should read --($\theta$)--;

UNITED STATES PATENT AND TRADEMARK OFFICE
CERTIFICATE OF CORRECTION

PATENT NO. : 5,632,812

DATED : May 27, 1997

INVENTOR : KEIJI HIRABAYASHI

It is certified that error appears in the above-identified patent and that said Letters Patent is hereby corrected as shown below:

<u>COLUMN 4</u> continued

Line 59 "angle ⊖ " should read --angle $\theta$--.

<u>COLUMN 5</u>

Line 9,  "the these" should read --of these--;
  Line 11, "combinedly used." should read --used in combination.--;
  Line 23, "specially" should read --especially--;
  Line 43, "that" should be deleted;
  Line 52, "that" should be deleted;
  Line 65, "$\mu$m/hr)" should read --$\mu$m/hr).--.

<u>COLUMN 6</u>

Line 17, "The most" should read --Most--;
  Line 32, "results" should read --result--;
  Line 34, "smothness," should read --smoothness,--;
  Line 55, "diamond" should read --diamond crystal--.

<u>COLUMN 7</u>

Line 9,  "Firstly," should read --Initially,--;
  Line 12, "specially" should read --especially--;
  Line 28, "a" should be deleted.

UNITED STATES PATENT AND TRADEMARK OFFICE
CERTIFICATE OF CORRECTION

PATENT NO. : 5,632,812

DATED : May 27, 1997

INVENTOR : KEIJI HIRABAYASHI

It is certified that error appears in the above-identified patent and that said Letters Patent is hereby corrected as shown below:

COLUMN 9

Line 45, "film 43" should read --film 43 was formed--;
  Line 48, "ml/min," should read --ml/min),--.

COLUMN 10

Line 26, "Firstly," should read --Initially,--;
  Line 31, "(thicness:" should read --(thickness:--;
  Line 45, "serve" should read --serves--;
  Line 50, "electrodes 67" should read --electrode 67--.

COLUMN 11

Line 1, "Firstly," should read --Initially--;
  Line 46, "results," should read --result,--.

COLUMN 12

Line 14, "A" should read --An--;
  Line 55, "sources 86," should read --source 86,--;
  Line 65, "Firstly," should read --Initially,--.

COLUMN 13

Line 9, "results," should read --result,--.

UNITED STATES PATENT AND TRADEMARK OFFICE
CERTIFICATE OF CORRECTION

PATENT NO.  : 5,632,812

DATED       : May 27, 1997

INVENTOR    : KEIJI HIRABAYASHI

It is certified that error appears in the above-identified patent and that said Letters Patent is hereby corrected as shown below:

<u>COLUMN 14</u>

```
Line  2,  "diamond" should read --plate shaped diamond--;
Line  3,  "diamond" should read --plate shaped diamond--;
Line  9,  "is" should be deleted;
Line 10,  "atom number" should read --atoms--; (both
          occurrences);
Line 16,  "is" should be deleted;
Line 17,  "atom number" should read --atoms--; (both
          occurrences);
Line 22,  "the" should read --a--; and
Line 27,  "the" should read --a--.
```

Signed and Sealed this

Twentieth Day of January, 1998

Attest:

Attesting Officer

BRUCE LEHMAN

Commissioner of Patents and Trademarks